(12) United States Patent
Lee et al.

(10) Patent No.: US 10,497,770 B2
(45) Date of Patent: Dec. 3, 2019

(54) DISPLAY DEVICE

(71) Applicant: SAMSUNG DISPLAY CO., LTD., Yongin-si, Gyeonggi-Do (KR)

(72) Inventors: Jin-Suk Lee, Gwangmyeong-si (KR); Seong Ryong Lee, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/856,886

(22) Filed: Dec. 28, 2017

(65) Prior Publication Data

US 2018/0337223 A1 Nov. 22, 2018

(30) Foreign Application Priority Data

May 18, 2017 (KR) .................. 10-2017-0061857

(51) Int. Cl.
*H01L 27/32* (2006.01)
*H01L 27/12* (2006.01)
*H01L 51/00* (2006.01)

(52) U.S. Cl.
CPC ...... *H01L 27/3276* (2013.01); *H01L 27/1218* (2013.01); *H01L 27/1244* (2013.01); *H01L 27/124* (2013.01); *H01L 27/1288* (2013.01); *H01L 51/0097* (2013.01); *H01L 2227/323* (2013.01); *H01L 2251/5338* (2013.01)

(58) Field of Classification Search
CPC ........... H01L 2251/5338; H01L 27/323; H01L 27/3244; H01L 27/3276; H01L 51/0097; H01L 51/5243; H01L 51/5246; H01L 51/5253; H01L 51/5262; H01L 51/5281; H01L 27/1218; H01L 27/124; H01L 27/1288
See application file for complete search history.

(56) References Cited

U.S. PATENT DOCUMENTS

| 9,287,329 | B1* | 3/2016 | Lee | H01L 51/0097 |
| 9,318,427 | B2* | 4/2016 | Youn | H01L 23/4985 |
| 9,356,087 | B1* | 5/2016 | Lee | H01L 27/3276 |
| 2012/0218219 | A1* | 8/2012 | Rappoport | H01L 27/3276 345/174 |

(Continued)

FOREIGN PATENT DOCUMENTS

| JP | 2003-060122 | 2/2003 |
| KR | 1020080049043 | 6/2008 |

(Continued)

*Primary Examiner* — Mohammed Shamsuzzaman
(74) *Attorney, Agent, or Firm* — F. Chau & Associates, LLC

(57) ABSTRACT

A display device includes a substrate including a first area, a second area, and a bending area. A plurality of first wires are positioned in the first area. A plurality of second wires are positioned in the second area. An insulating layer is positioned in the bending area. A plurality of connecting wires are disposed on the insulating layer. Each of the connecting wires is connected with at least one of the first wires and at least one of the second wires. Each of the connecting wires includes a first portion and a second portion alternatingly arranged along an extending direction of the connecting wires. A width of the first portion is wider than a width of the second portion in a direction perpendicular to the extending direction each of the connecting wires.

19 Claims, 11 Drawing Sheets

(56) References Cited

U.S. PATENT DOCUMENTS

| | | | | |
|---|---|---|---|---|
| 2014/0217373 A1* | 8/2014 | Youn | ................... | H01L 23/4985 |
| | | | | 257/40 |
| 2014/0217397 A1* | 8/2014 | Kwak | ................. | H01L 27/1218 |
| | | | | 257/43 |
| 2014/0232956 A1* | 8/2014 | Kwon | ............... | G02F 1/133305 |
| | | | | 349/12 |
| 2015/0187279 A1* | 7/2015 | Lee | ...................... | G09G 3/3225 |
| | | | | 257/40 |
| 2015/0327355 A1* | 11/2015 | Wolfel | ................. | H05K 1/0278 |
| | | | | 174/251 |
| 2016/0190522 A1* | 6/2016 | Lee | ................... | H01L 51/0097 |
| | | | | 257/40 |
| 2017/0194411 A1* | 7/2017 | Park | ................... | H01L 51/5253 |

FOREIGN PATENT DOCUMENTS

| | | |
|---|---|---|
| KR | 1020100097603 | 9/2010 |
| KR | 1020160114251 | 10/2016 |

\* cited by examiner

DISPLAY DEVICE

CROSS-REFERENCE TO RELATED APPLICATION

This application claims priority to Korean Patent Application No. 10-2017-0061857 filed in the Korean Intellectual Property Office on May 18, 2017, the disclosure of which is incorporated by reference herein in its entirety.

TECHNICAL FIELD

Exemplary embodiments of the present invention relate to a display device, and more particularly to a display device including connecting wires with varying widths.

DISCUSSION OF RELATED ART

A display device such as an organic light emitting diode display and a liquid crystal display may include various wires and elements. Display devices may have relatively high resolution.

Forming relatively more wires and elements on a substrate in a predetermined area may increase the resolution of the display device. Widths of wires may be reduced in a particular area. However, the adhesion between the wires and a lower layer may be weakened as an area of the wires contacting the lower layer becomes smaller, which may increase a likelihood that the wires are lifted.

SUMMARY

A display device according to an exemplary embodiment of the present invention includes a substrate including a first area, a second area, and a bending area between the first area and the second area. A plurality of first wires are positioned in the first area. A plurality of second wires are positioned in the second area. An insulating layer is positioned in the bending area. A plurality of connecting wires are disposed on the insulating layer. Each of the plurality of connecting wires is connected with at least one of the plurality of first wires and at least one of the plurality of second wires. Each of the plurality of connecting wires includes a first portion and a second portion alternatingly arranged along an extending direction of each of the plurality of connecting wires. A width of the first portion is wider than a width of the second portion in a direction perpendicular to the extending direction each of the plurality of connecting wires.

At least one of the plurality of connecting wires may be in direct contact with the insulating layer.

At least one of the plurality of connecting wires may include a metal material, and the insulating layer may include an organic insulating material.

The first portion may protrude from opposite sides of the second portion along the direction perpendicular to the extending direction of each of the plurality of connecting wires.

The first portion may protrude from one side of the second portion.

The plurality of connecting wires may include a first connecting wire and a second connecting wire which are adjacent to each other. The first portion of the first connecting wire may be disposed in parallel with the second portion of the second connecting wire along the direction perpendicular to the extending direction of each of the plurality of connecting wires.

The first portion of each of the plurality of connecting wires may have a smaller width along the extending direction of each of the plurality of connecting wires than that of the second portion.

The insulating layer may include a plurality of peaks and a plurality of valleys. The first portion may be disposed on one of the plurality of peaks.

The first portion may be disposed over at least two of the plurality of peaks.

At least one of the plurality of connecting wires may be a data signal line for transferring data signals.

A display device according to an exemplary embodiment of the present invention includes a substrate including a bending area that is bent around a bending axis that is in parallel with a first direction. A wire linearly extends in a second direction that crosses the first direction in the bending area. The wire includes a first portion having a first width along the first direction and a second portion having a second width along the first direction. A first insulating layer is disposed between the substrate and the wire in the bending area. The first insulating layer includes an organic insulating material. The first width of the first portion is wider than the second width of the second portion.

The wire may include a metal material. A lower surface of the wire may be in direct contact with an upper surface of the first insulating layer.

A lower surface of the first insulating layer may be in direct contact with an upper surface of the substrate.

A second insulating layer may be disposed on the first insulating layer and may include an organic insulating material. An upper surface of the wire may be in direct contact with a lower surface of the second insulating layer.

A second insulating layer may be disposed on the first insulating layer and may include an organic insulating material. A lower surface of the wire may be in direct contact with an upper surface of the second insulating layer.

The first portion and the second portion may be alternatingly arranged along an extending direction of the wire.

A difference between the first width and the second width may be about 1 µm or more.

The first insulating layer may include a plurality of peaks and a plurality of valleys that are alternatingly formed along the second direction. The first portion may be disposed on one of the plurality of peaks.

The first portion may be disposed over at least two of the plurality of peaks.

The wire might not include an opening therein.

According to an exemplary embodiment of the present invention, it is possible to secure a wiring structure with relatively strong adhesion to a lower layer below the wiring structure while forming a relatively large number of wires in a limited area. Thus, a relatively high-resolution display device may be formed with increased reliability of wires.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EMBODIMENTS

Figure 1:
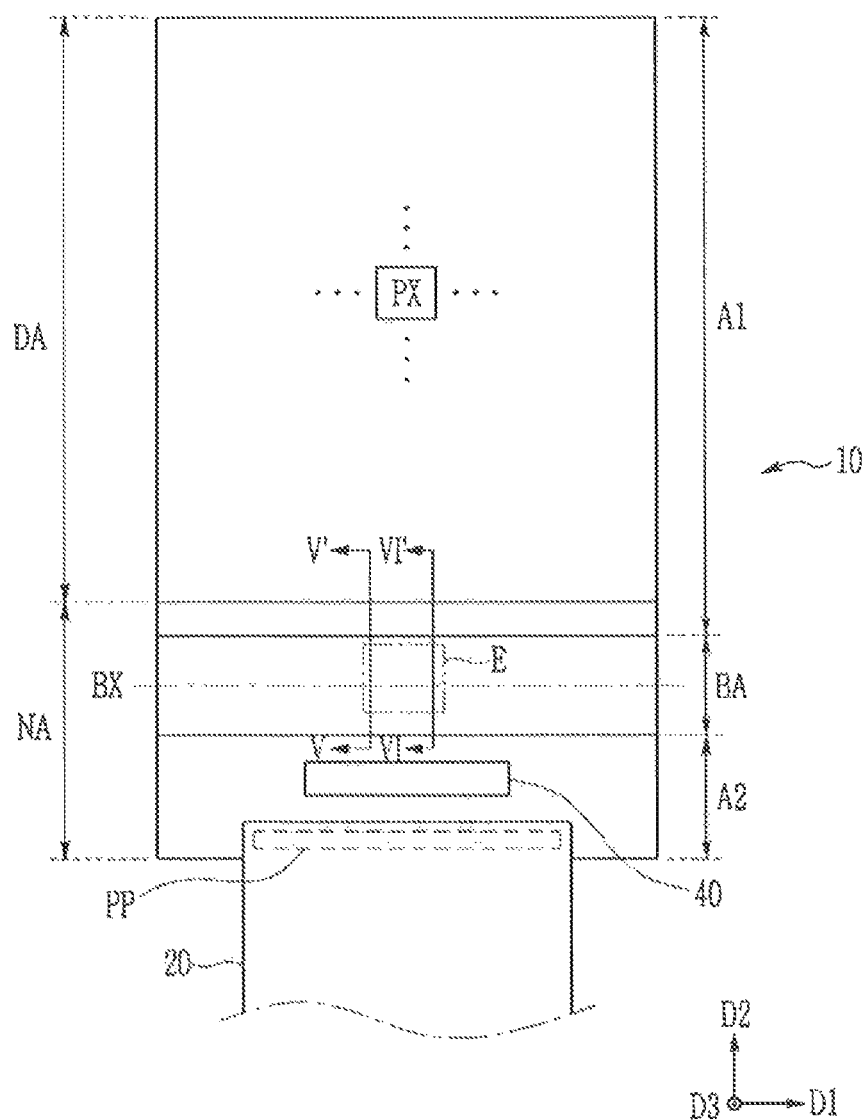
FIG. 1 is a top plan view schematically illustrating an un-bent display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

It will be understood that when a component, such as a layer, a film, a region, or a plate, is referred to as being "on" another component, the component may be directly on the other component or intervening components may be present.

Figure 2:
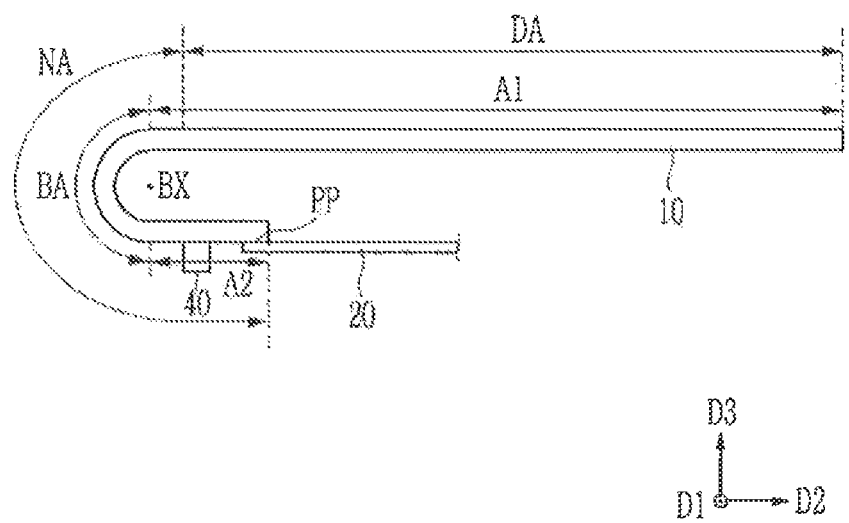
FIG. 2 is a side view of the display device illustrated in FIG. 1 after being bent.
Figure 3:
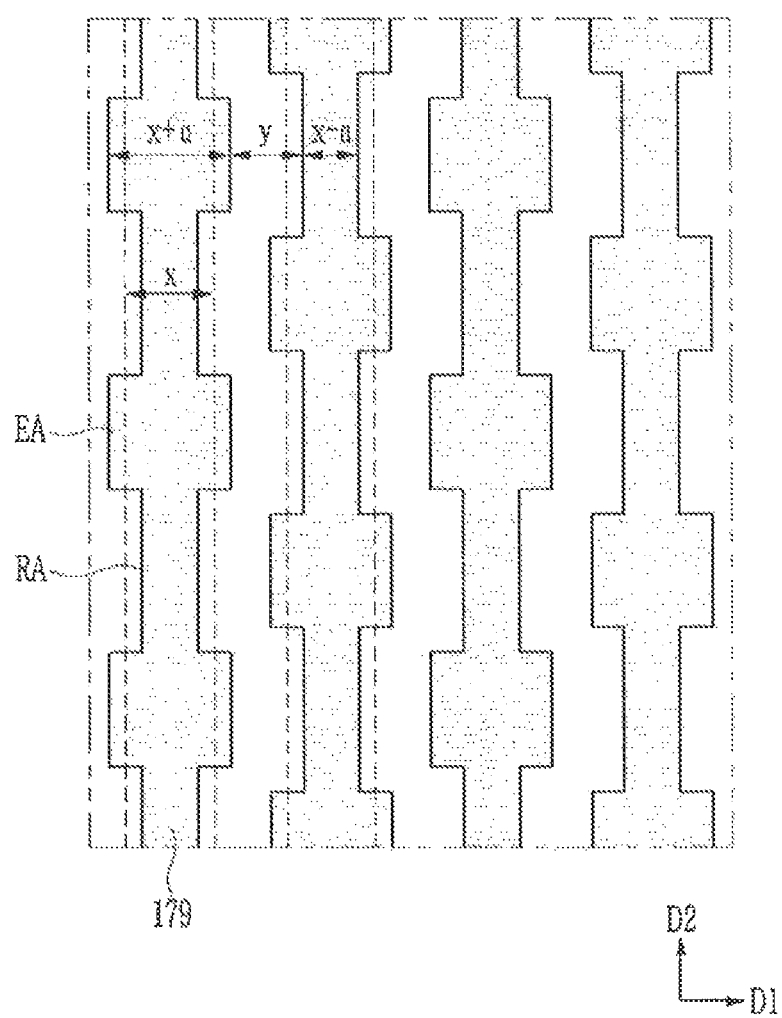
FIG. 3 and FIG. 4 are each enlarged views illustrating a region E in FIG. 1 according to an exemplary embodiment of the present invention.
Figure 4:
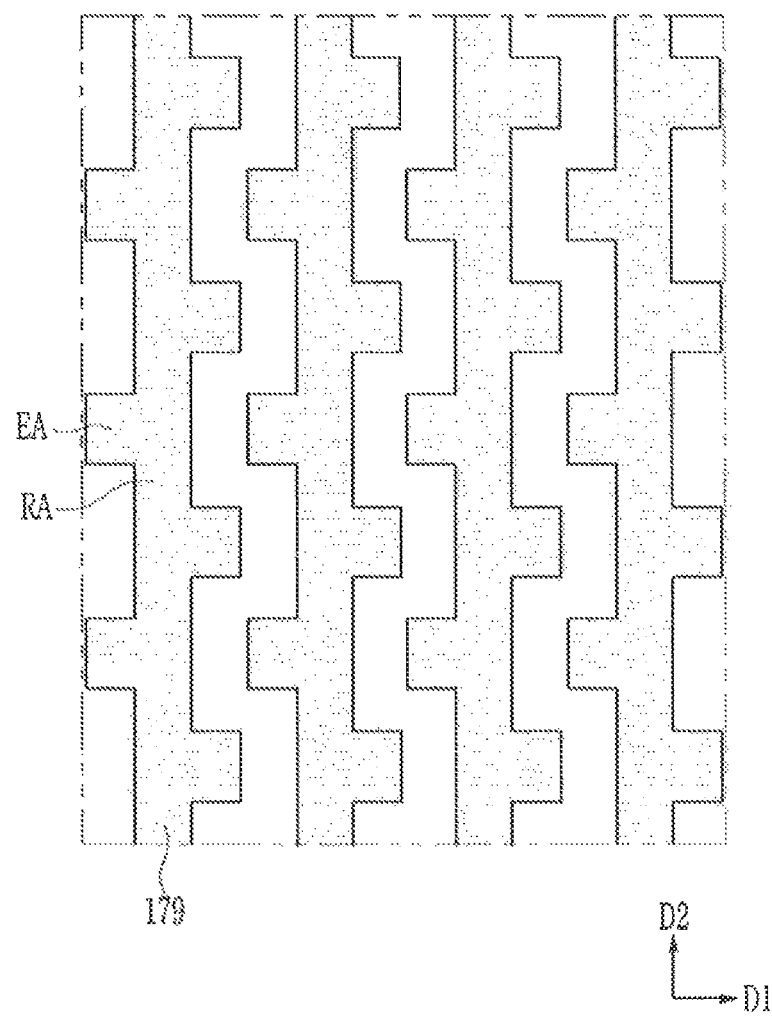

FIG. 1 is a top plan view schematically illustrating an un-bent display device according to an exemplary embodiment of the present invention. FIG. 2 is a side view of the display device illustrated in FIG. 1 after being bent. FIG. 3 and FIG. 4 are each enlarged views illustrating a region E in FIG. 1 according to an exemplary embodiment of the present invention.

Referring to FIG. 1, a display device according to an exemplary embodiment of the present invention may include a display panel 10 and a flexible printed circuit film 20 connected with the display panel 10.

The display panel 10 in which elements for displaying images are formed on a substrate may include a display area DA for displaying the images, and a non-display area NA positioned at an outer circumference of the display area DA, in which elements and/or wires for generating and/or transferring various signals that are applied to the display area DA are positioned. Although a lower area of the display panel 10 is illustrated in FIG. 1 as the non-display area NA, left and right edges and/or an upper edge of the display panel 10 may serve as the non-display area NA.

Pixels PX may be arranged, for example, in a matrix form in the display area DA of the display panel 10. Signal lines such as gate lines and data lines may be positioned in the display area DA. The gate lines may extend substantially in a first direction D1 (e.g., a row direction), and the data lines may extend substantially in a second direction D2 (e.g., a column direction) crossing the first direction D1. Each of the pixels PX may be connected to a gate line and a data line to receive a gate signal and a data signal therefrom. In the case of an organic light emitting diode display, driving voltage lines, which extend, for example, in the second direction D2 to transmit a driving voltage to the pixels PX, may be positioned in the display area DA.

The display area DA may include a touch sensor layer for sensing a contact or non-contact touch of a user. Although the display area DA is illustrated to have a quadrangular shape, the display area DA may have various shapes such as a polygonal shape, a circular shape, or an elliptical shape, for example.

A pad unit PP including pads for receiving signals from the outside may be positioned in the non-display area NA of the display panel 10. The pads of the pad unit PP may be connected with the wires disposed in the non-display area NA. A first end of the flexible printed circuit film 20 may be bonded to the pad unit PP. A second end of the flexible printed circuit film 20 may be connected with, e.g., an external printed circuit board (PCB) to transmit a signal such as image data.

A driving device for generating and/or processing various signals for driving the display panel 10 may be positioned in the non-display area NA, and may be positioned in the flexible printed circuit film 20 bonded to the pad unit PP. The driving device may include a data driver which applies a data signal to the data line, a gate driver which applies a gate signal to the gate line, and a signal controller which controls the gate driver.

The data driver may be positioned in the non-display area NA between the display area DA and the pad unit PP in a form of an integrated circuit chip 40. The data driver may be positioned in the flexible printed circuit film 20 in a form of an integrated circuit chip to be connected to the pad unit PP in a form of a tape carrier package (TCP). The gate driver may be provided in a form of an integrated circuit chip, or may be integrated in the non-display area of the left/right edge of the display panel 10. The signal controller may include an integrated circuit chip 40, or may be provided as a separate integrated circuit chip Referring to FIG. 1 and FIG. 2, the display panel 10 may include a bending area BA between the display area DA and the pad unit PP. The bending area BA may be bent around a bending axis BX. Referring to FIG. 2, the bending area BA is a region that is bendable in a predetermined curvature radius in the display panel 10. The bending area BA may be positioned to cross the display panel 10 in a first direction D1. The display panel 10 may be bent around the bending axis BX parallel to the first direction D1, so that the flexible printed circuit film 20 may be positioned behind the display area DA.

While the bending area BA may be bent around one bending axis BX, exemplary embodiments of the present invention are not limited thereto, and the bending area BA may be bent about two or more bending axes. Although the bending area BA may be positioned in the non-display area NA, exemplary embodiments of the present invention are not limited thereto, and the bending area BA may extend over the display area DA and the non-display area NA, or may be positioned in the display area DA. Wires for transferring signals inputted through the pads of the pad unit PP or signals generated in the driver to the display area DA may be disposed on an insulating layer including an organic material.

The display panel 10 may include the bending area BA, a first area A1 positioned at a first side of the bending area BA, and a second area A2 positioned at a second side of the bending area BA. The first area A1, the bending area BA, and the second area A2 may be arranged in this stated order along the second direction D2. The first area A1 may include the display area DA, and the integrated circuit chip 40 and the pad unit PP may be positioned in the second area A2. According to an exemplary embodiment of the present invention, the non-display area NA may include a portion of the first area A1 adjacent to the bending area BA, the bending area BA, and the second area A2. A supporter or an adhesive member for maintaining a predetermined state may be positioned between the first area A1 and the second area A2.

Wires disposed in the bending area BA may be connected with wires and/or terminals positioned in the first area A1 and the second area A2, and may be referred to as "connecting wires."

The connecting wires (see, e.g., connecting wires 179 discussed in more detail below) may include data signal lines for transferring data signals to the data lines. As the resolution of the display device increases, a number of pixel columns may increase, so that a number of the data signal lines may also increase. Thus, widths of the data signal lines may be reduced as the resolution of the display device increases. The connecting wires may be positioned to cross the bending area BA, to extend in a direction substantially parallel to the second direction D2 or obliquely with respect to the second direction. When the bending area BA is bent, the connecting wires may be bent. The connecting wires may include a metal having relatively high flexibility. As the flexibility of the connecting wires increases, an occurrence of stress to the wires (e.g., when bent) may be reduced, thus reducing the risk of deterioration or disconnection during bending.

Referring to FIG. 3, wires 179 positioned in the bending area BA are illustrated. The wires 179 may be positioned relatively closely to each other, and a maximum width (x+α) of the wires 179 may be, e.g., about 15 μm or less, for example, about 10 μm or less, or about 5 μm or less. An overall extending direction of the wires 179 may be along a substantially straight line. The wires 179 may include a relatively wide extended portion EA and a relatively narrow reduced portion RA, which are alternatingly formed along an extending direction of the wires 179. In one wire 179, each of the extended portions EA may have substantially a same size as each other. According to an exemplary embodiment of the present invention, each of the extended portions EA may have different sizes from each other. In one wire 179, the extended portions EA may have substantially a same space interval therebetween or different space intervals therebetween along the extending direction of the wire 179. In one wire 179, each of the reduced portions RA may have substantially a same size as each other. According to an exemplary embodiment of the present invention, each of the reduced portions RA may have different sizes from each other. In one wire 179, the reduced portions RA may have substantially a same space interval therebetween or different space intervals therebetween along the extending direction of the wire 179.

A width of the extended portion EA may be x+α μm, and a width of the reduced portion RA may be x−α μm. Herein, "x" corresponds to a reference width according to a predetermined width, and "α" is greater than 0. Adhesion to the insulating layer positioned below the wires 179 may be increased compared with the case where the wires 179 are constantly formed to have a width of x μm. The adhesion increases as the contact area increases, and since the extended portions EA of the wires 179 are in direct contact with the insulating layer over a relatively large area, the adhesion at the extended portions EA is relatively high. In contrast, the reduced portions RA are in direct contact with the insulating layer over a relatively small area, and thus the adhesion at the reduced portions RA is relatively low. However, the extended portions EA are strongly attached to the insulating layer, and thus the reduced portions RA positioned between the extended portions EA may be prevented from being lifted to suppress the wires 179 from being lifted from the insulating layer.

As an example, the wires 179 may be formed by depositing a metal material on the insulating layer by a sputtering method and then by using a photolithography process. In the photolithography process, a metal material layer is etched by using a photoresist as a mask to form the wires 179, and then the photoresist is removed through a wet process (e.g., stripping, and washing). In this case, the wires 179 may be partially lifted in the insulating layer. When the wires 179 are lifted, disconnection or degradation may occur. According to an exemplary embodiment of the present invention, the adhesion to the insulating layer disposed below the wires 179 may be increased by partially widely forming the wires 179, thus reducing or eliminating lifting or partial lifting of the wires 179.

As an example, when a width of the wires 179 is 3.5 μm or less, the wires 179 may be lifted. Accordingly, "x+α" corresponding to the width of the extended portion EA may be greater than 3.5, and "x−α" may be equal to or smaller than 3.5. "α" may be equal to or greater than 0.5, and thus a width difference between the extended portion EA and the reduced portion RA may be 1 μm or more. Sizes of the extended portion EA and the reduced portion RA may be variously designed in consideration of, for example, the adhesion of the wires 179 to the insulating layer, and/or resistance of the wires 179.

The extended portions EA and the reduced portions RA of the wires 179 may be complementarily formed between the adjacent wires 179 such that an extended portion EA of a first wire faces a reduced portion RA of an adjacent wire along a direction perpendicular to the extending direction of the wire 170. For example, in two adjacent wires 179, the extended portion EA of a first wire 179 and the reduced portion RA of a second wire 179 may be disposed in parallel. Accordingly, the extended portions EA and the reduced portions RA of the wires 179 may be alternatingly and repeatedly disposed along the first direction one by one. Thus, it is possible to secure an area for forming the extended portions EA while maintaining a distance between the wires 179, by complementarily forming the extended portions EA and the reduced portions RA of the adjacent wires 179. When the width of the wires 179 is generally increased, the distance between the adjacent wires 179 is reduced to increase the coupling capacitance, and thus image deterioration caused by crosstalk may occur and a short circuit between the wires 179 may occur. According to an exemplary embodiment of the present invention, the interval between the adjacent wires 179 may be made substantially constant over an entire length of the wires 179. The distance between the adjacent wires 179 may be y μm. Herein, "y" may be 2.5 μm or more, but may be smaller than 2.5 μm, and may be modified depending on design rules.

According to an exemplary embodiment of the present invention, the extended portion EA of each of the connecting wires 179 of the plurality of connecting wires may have a smaller width along the extending direction of the plurality of connecting wires than that of the reduced portion RA.

According to an exemplary embodiment of the present invention, the extended portion EA includes portions protruded at opposite sides of the reduced portion RA based on a central axis of the longitudinal direction of the connecting wire 179, but exemplary embodiments of the present invention are not limited thereto. For example, referring to FIG. 4, the extended portion EA may include a portion protruded toward one side of the reduced portion RA. The protruded portion of the extended portion EA may be alternatingly positioned at right and left sides of the reduced portion RA along the length of the wires 179.

A stacked structure of the display panel 10 and connecting wires according to an exemplary embodiment of the present invention will be described in more detail below based on the bending area BA as well as the pixels PX of the display panel 10. An organic light emitting diode display will be described in more detail below as an example.

Figure 5:
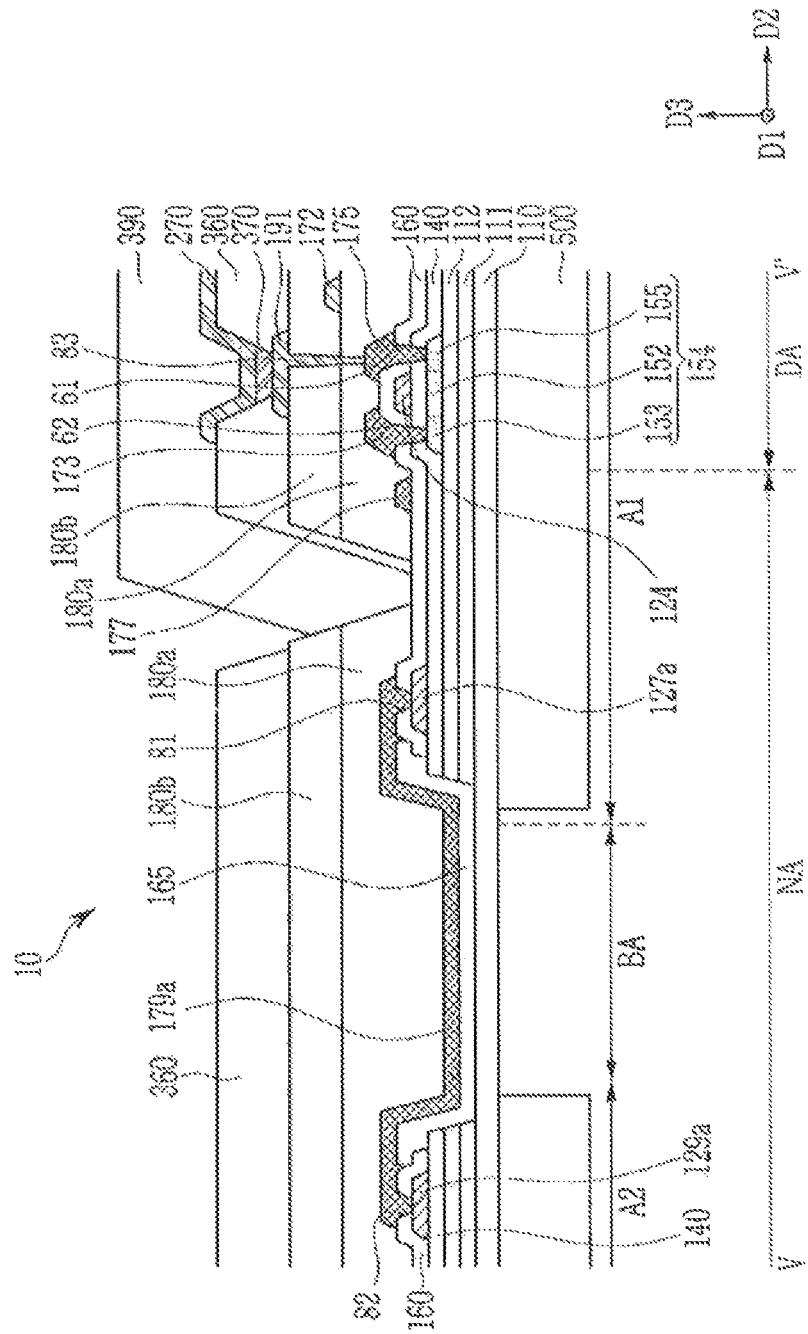
FIG. 5 is a cross-sectional view taken along a line V-V' in FIG. 1 according to an exemplary embodiment of the present invention.
Figure 6:
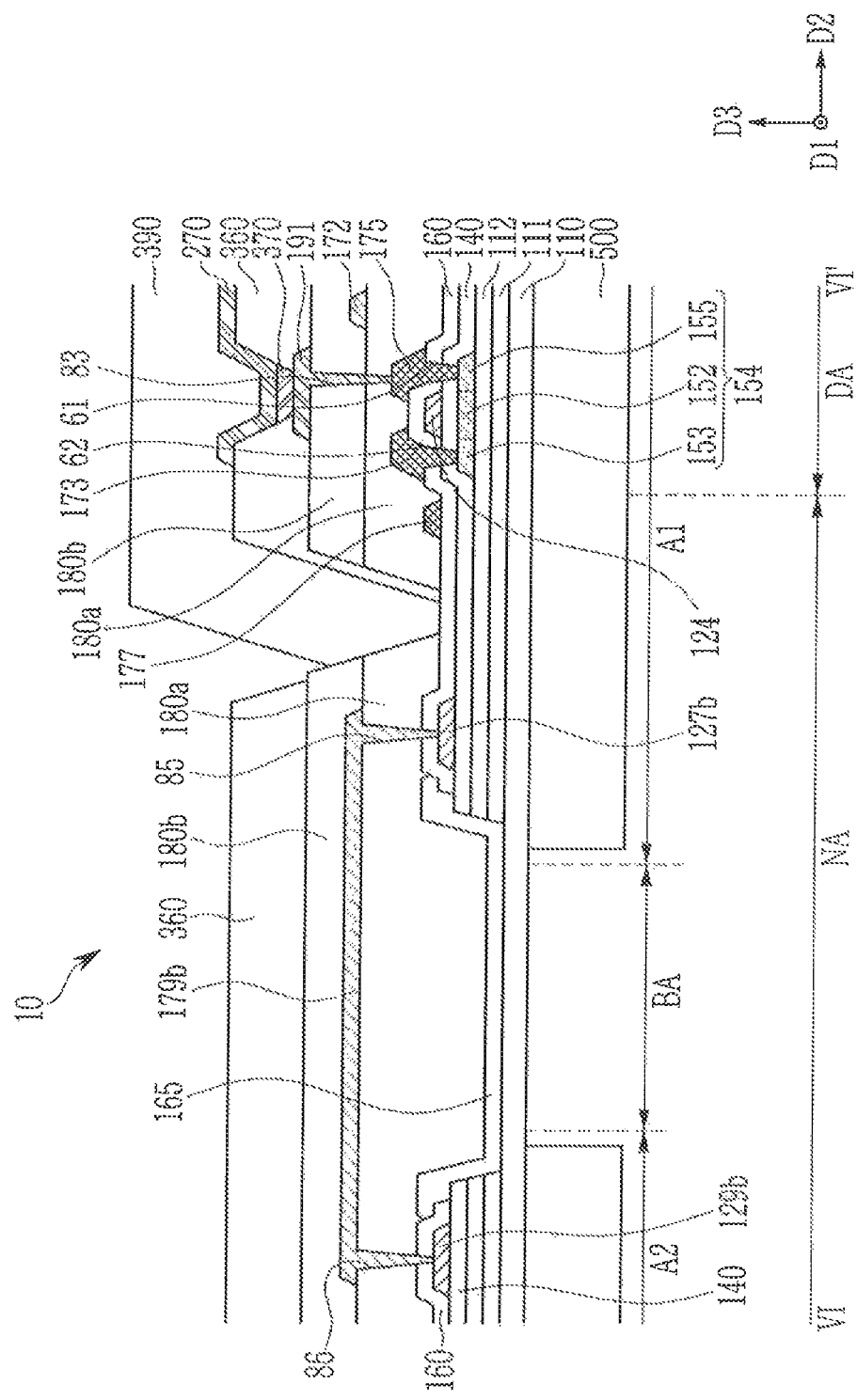
FIG. 6 is a cross-sectional view taken along a line VI-VI' in FIG. 1 according to an exemplary embodiment of the present invention.

FIG. 5 is a cross-sectional view taken along a line V-V' in FIG. 1 according to an exemplary embodiment of the present invention. FIG. 6 is a cross-sectional view taken along a line VI-VI' in FIG. 1 according to an exemplary embodiment of the present invention.

Configurations of FIG. 5 and FIG. 6 are substantially the same except for a difference in positions of connecting wires 179*a* and 179*b*. Referring to FIG. 3 and FIG. 4, the connecting wires 179*a* and 179*b* are substantially the same as the wires 179 described in more detail above. Accordingly, planar shapes of the connecting wires 179*a* and 179*b* may be the same as those described above with reference to FIG. 3 or FIG. 4. Thus, duplicative descriptions may be omitted below.

Referring to FIG. 5 and FIG. 6, the display panel 10 may include a substrate 110 and a plurality of layers and wires formed thereon. Although a relatively large number of pixels may be arranged in the display area DA of the display panel 10, only one pixel is illustrated in FIG. 3. Each pixel may include transistors, a capacitor, and an organic light emitting diode, but a stacked structure of the display panel 10 will be described including a description of one transistor and one organic light emitting diode connected thereto.

The substrate 110 may be a flexible substrate. The substrate 110 may include a polymer such as polyimide, polycarbonate, or polyethylene terephthalate, but exemplary embodiments of the present invention are not limited thereto.

A barrier layer 111 and a buffer layer 112 may be disposed on the substrate 110 to reduce or eliminate a diffusion of impurities which may cause degradation of semiconductor characteristics, and to reduce or eliminate moisture penetration. The barrier layer 111 and the buffer layer 112 may include an inorganic insulating material such as a silicon oxide (SiOx) or a silicon nitride (SiNx). The barrier layer 111 and the buffer layer 112 may be formed on an entire surface of the substrate 110, but need not be disposed on the bending area BA. A layer formed of the inorganic insulating material may be vulnerable to bending, and thus cracks may occur, or it may damage the wiring located in the bending area BA. Thus, either of the barrier layer 111 and the buffer layer 112 may be omitted (e.g., in the bending area BA).

A semiconductor layer 154 of a transistor may be disposed on the buffer layer 112. The semiconductor layer 154 may include a channel region 152, and a source region 153 and a drain region 155 doped and disposed at opposite sides of the channel region 152. The semiconductor layer 154 may include polysilicon, amorphous silicon, or an oxide semiconductor.

A gate insulating layer 140 including an inorganic insulating material such as a silicon oxide or a silicon nitride may be disposed on the semiconductor layer 154. The gate insulating layer 140 need not be positioned in the bending area BA.

A gate conductor including a gate line, a gate electrode 124 of the transistor, first wires 127*a* and 127*b*, and second wires 129*a* and 129*b* may be disposed on the gate insulating layer 140. The gate conductor may include a metal such as molybdenum (Mo), copper (Cu), aluminum (Al), silver (Ag), chromium (Cr), tantalum (Ta), or titanium, or a metal alloy thereof. The gate electrode 124 may overlap the channel region 152 of the semiconductor layer 154 along a direction orthogonal to an upper surface of the substrate 110. The first wires 127*a* and 127*b* may be connected to the display area DA (e.g., a data line and a signal line such as a driving voltage line), a driver (e.g., a gate driver), and the second wires 129*a* and 129*b* may be connected to a terminal of the integrated circuit chip 40, and a pad of the pad unit PP.

An interlayer insulating layer 160 may be disposed on the gate insulating layer 140 and the gate conductor. The interlayer insulating layer 160 may include an inorganic insulating material such as a silicon oxide, a silicon nitride, a silicon oxynitride (SiON), or a silicon oxyfluoride (SiOF). The interlayer insulating layer 160 need not be disposed in the bending area BA.

A first data conductor including a data line, a source electrode 173 and a drain electrode 175 of the transistor, a voltage transfer line 177, and the connecting wire 179*a* may be disposed on the interlayer insulating layer 160. The source electrode 173 and the drain electrode 175 may be respectively connected to the source region 153 and the drain region 155 of the semiconductor layer 154 through contact holes 61 and 62 formed in the interlayer insulating layer 160 and the gate insulating layer 140. The voltage transfer line 177 may transfer a power-source voltage such as a driving voltage or a common voltage.

The connecting wire 179*a* may be positioned in the bending area BA. The connecting wire 179*a* may be connected with the first wire 127*a* through a contact hole 81 formed in the interlayer insulating layer 160 in the first area A1, and may be connected with the second wire 129*a* through a contact hole 82 formed in the interlayer insulating layer 160 in the second area A2. Thus, the first wire 127*a* and the second wire 129*a* which are gate conductors may be electrically connected to each other by the connecting wire 179*a*. Thus, a signal output from the integrated circuit chip 40 and the pad may be transmitted to the display area DA, and the driving device through the second wire 129*a*, the connecting wire 179*a*, and the first wire 127*a*.

As an example, the first data conductor may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), or tantalum (Ta), or a metal alloy thereof. The first data conductor may have a multilayer structure, and may have a triple-layer structure including, e.g., a bottom layer (e.g., an ancillary layer) for increasing contact properties and an upper layer (e.g., a capping layer) for preventing oxidation. The lower layer and the upper layer may include titanium (Ti), chromium (Cr), molybdenum (Mo), or tantalum (Ta), for example. The first data conductor may be a multilayer such as titanium/aluminum/titanium (Ti/Al/Ti), titanium/copper/titanium (Ti/Cu/Ti), or molybdenum/aluminum/titanium (Mo/Al/Mo), but exemplary embodiments of the present invention are not limited thereto.

In the bending area BA, a protective layer 165 which is an insulating layer is disposed between the substrate 110 and the connecting wire 179*a*. The protective layer 165 may overlap the gate insulating layer 140 and the interlayer insulating layer 160 in the first area A1 and the second area A2 along the direction orthogonal to the upper surface of the substrate 110. The protective layer 165 may be in direct contact with the upper surface of the substrate 110 in the bending area BA. The protective layer 165 may include an organic insulating material. For example, the organic insulating material may include, but is not limited to, a polyimide, an acrylic polymer, or a siloxane-based polymer.

The connecting wire 179a including a metal material may be disposed on the protective layer 165 including an organic insulating material. Adhesion of the metal wire to the organic insulating layer may be weaker than adhesion to the inorganic insulating layer. When a width of the connecting wire 179a is reduced to, e.g., 3.5 µm or less, the connecting wire 179a may be partially lifted, and thus the connecting wire 179a may be separated or disconnected. However, as described above with reference to FIG. 3 and FIG. 4, in the connecting wire 179a, extended portions EA and reduced portions RA may be repeatedly formed along the extending direction of the connecting wire 179a, and the adhesion may be increased by the extended portions EA, which may reduce or eliminate an occurrence of the connecting wire 179a being lifted from the protective layer 165.

The gate electrode 124, the source electrode 173, and the drain electrode 175 may form a transistor together with the semiconductor layer 154. The transistor may be a driving transistor in a pixel of the organic light emitting diode display. The transistor may be a top-gate transistor in which the gate electrode 124 is disposed above the semiconductor 154, but a structure of the transistor is not limited thereto, and may be variously modified. As an example, the transistor may be a bottom-gate transistor in which the gate electrode is positioned below the semiconductor layer, or may be a vertical transistor in which the gate electrode is positioned in a side surface of the semiconductor layer.

A first planarization layer 180a may be disposed on the interlayer insulating layer 160 and the first data conductor. The first planarization layer 180a may be positioned in and around the bending area BA. In the bending area BA, the first planarization layer 180a may be disposed on the protective layer 165. According to an exemplary embodiment of the present invention, the display device need not include the protective layer 165, and the first planarization layer 180a may be in direct contact with the substrate 110.

A second data conductor including a driving voltage line 172 and the connecting wire 179b may be disposed on the first planarization layer 180a. A second planarization layer 180b may be disposed on the second data conductor.

The first planarization layer 180a and the second planarization layer 180b may include an organic insulating material such as a polyimide, an acryl-based polymer, or a siloxane-based polymer, but exemplary embodiments of the present invention are not limited thereto. For example, the second data conductor may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), or tantalum (Ta), or a metal alloy thereof. The second data conductor may be a multilayer, and may have a triple-layer structure including, e.g., a bottom layer (e.g., an ancillary layer) for increasing contact properties and an upper layer (e.g., a capping layer) for preventing oxidation. The lower layer and the upper layer may include titanium (Ti), chromium (Cr), molybdenum (Mo), or tantalum (Ta), for example. The second data conductor may be a multilayer such as titanium/aluminum/titanium (Ti/Al/Ti), titanium/copper/titanium (Ti/Cu/Ti), or molybdenum/aluminum/titanium (Mo/Al/Mo), but exemplary embodiments of the present invention are not limited thereto.

The connecting wire 179b may be positioned in the bending area BA. The connecting wire 179b (and the connecting wire 179a described above) may extend slightly beyond the bending area BA. The connecting wire 179b may be connected with the first wires 127b through a contact hole 85 formed in the first planarization layer 180a and the interlayer insulating layer 160 in the first area A1, and may be connected with the second wires 129b through a contact hole 86 formed in the first planarization layer 180a and the interlayer insulating layer 160 in the second area A2. Thus, the first wires 127b and the second wires 129b which are gate conductors may be electrically connected to each other by the connecting wire 179b. Thus, a signal output from the integrated circuit chip 40 and the pad may be transmitted to the display area DA, and the driving device through the second wire 129b, the connecting wire 179a, and the first wires 127b.

The connecting wire 179b may be disposed on the first planarization layer 180a including the organic insulating material in the bending area BA. Similar to the connecting wire 179a (see, e.g., FIG. 3 and FIG. 4), in the connecting wire 179b, extended portions EA and reduced portions RA may be repeatedly formed along an extending direction of the connecting wire 179b. The adhesion may be increased by the extended portions EA to prevent the connecting wire 179b from being lifted from the first planarization layer 180a.

The connecting wire 179a may be sandwiched between the protective layer 165 and the first planarization layer 180a, and the connecting wire 179b may be sandwiched between the first planarization layer 180a and the second planarization layer 180b. Thus, in the bending area, the connecting wire 179a may be surrounded by the first planarization layer 180a and the protective layer 165 including the organic insulating material, and the connecting wire 179b may be surrounded by the second planarization layer 180b and the first planarization layer 180a including the organic insulating material. Thus, the connecting wire 179a and the connecting wire 179b may be prevented from being damaged during bending.

According to an exemplary embodiment of the present invention, when the connecting wires 179a and 179b are formed by using a first data conductor and a second data conductor which are disposed at different layers, the connecting wires 179a and 179b may be formed as two layers to increase a width of each connecting wire, and thus the resistance may be reduced. For example, referring to FIG. 1, the connecting wire 179a and the connecting wire 179b may be alternatingly disposed in the first direction D1 one by one. According to an exemplary embodiment of the present invention, the connecting wires may be formed by only using the first data conductor or the second data conductor, and thus may only include the connecting wires 179a or the connecting wires 179b.

In the display area DA, a pixel electrode 191 may be disposed on the second planarization layer 180b. The pixel electrode 191 of each pixel may be connected to the drain electrode 175 through a contact hole 83 formed in the first planarization layer 180a and the second planarization layer 180b. The pixel electrode 191 may include a reflective conductive material or a transflective conductive material, or may include a transparent conductive material.

A pixel definition layer 360 including an opening that overlaps the pixel electrode 191 along the direction orthogonal to the upper surface of the substrate 110 may be disposed on the second planarization layer 180b. The opening of the pixel definition layer 360 may define each pixel area. The pixel definition layer 360 may include an organic insulating material. The pixel definition layer 360 may be disposed on the second planarization layer 180b in the bending area BA.

An emission member 370 may be disposed on the pixel electrode 191. The emission member 370 may include a first organic common layer, an emission layer, and a second organic common layer which are stacked in sequence. The first organic common layer may include at least one of a hole-injection layer and a hole-transporting layer. The emission layer may include an organic material which uniquely emits light of one of primary colors such as red, green, or blue, and may have a structure in which a plurality of organic material layers emitting light of different colors are stacked. The second organic common layer may include at least one of an electron-transporting layer or an electron-injection layer.

A common electrode 270 for transferring a common voltage may be disposed on the emission member 370. The common electrode 270 may include a transparent conductive material such as ITO or IZO, or may be formed by thinly stacking a metal such as calcium (Ca), barium (Ba), magnesium (Mg), aluminum (Al), or silver (Ag), to have relatively light permeability. The pixel electrode 191, the emission member 370, and the common electrode 270 of each pixel may be a light-emitting element which is an organic light emitting diode.

An encapsulation layer 390 may be disposed on the common electrode 270. The encapsulation layer 390 may encapsulate the emission member 370 and the common electrode 270 to prevent permeation of external moisture or oxygen. The encapsulation layer 390 may include at least one layer including an inorganic material, and may further include at least one layer including an organic material. The encapsulation layer 390 need not be disposed in the bending area BA. A polarization layer for preventing external light reflection may be disposed on the encapsulation layer 390. The polarization layer need not overlap the bending area BA. In the bending area BA, a bending protective layer for releasing and protecting against tensile stress may be disposed on the pixel definition layer 360. The bending protective layer may be referred to as a stress neutralization layer.

A protection film 500 may be positioned below the substrate 110. The protection film 500 may be attached to the substrate 110 (e.g., a flexible substrate 110) by an adhesive such as a pressure sensitive adhesive (PSA) or an optically clear adhesive (OCA). The protection film 500 may include a polymer such as polyethylene terephthalate, polyethylene naphthalate, polyimide, or polyethylene sulfide. The protection film 500 need not be positioned in the bending area BA, which may reduce a bending stress.

Figure 7:
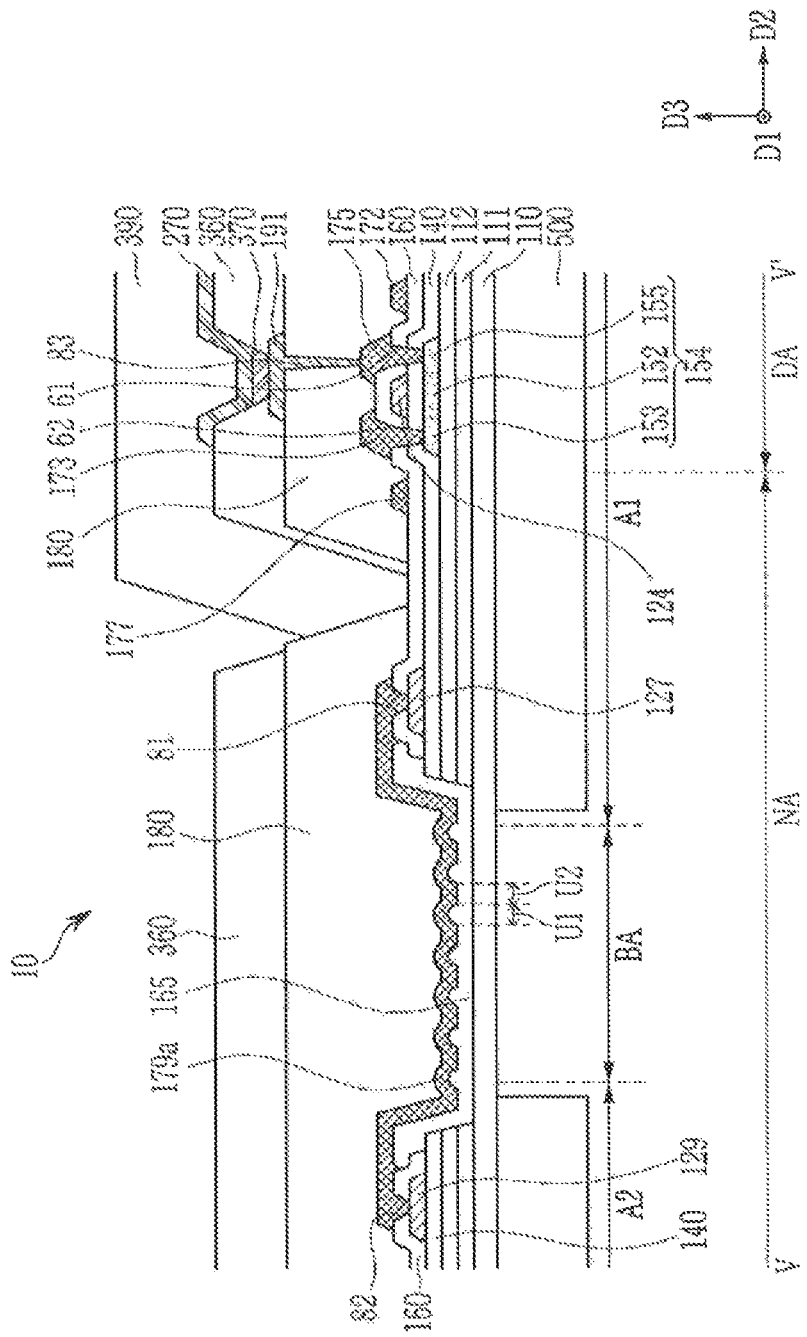
FIG. 7 is a cross-sectional view taken along a line V-V' in FIG. 1 according to an exemplary embodiment of the present invention.

FIG. 7 is a cross-sectional view taken along a line V-V' in FIG. 1 according to an exemplary embodiment of the present invention. FIGS. 8 to 11 are each enlarged views illustrating a region E in FIG. 1 according to an exemplary embodiment of the present invention.

Referring to FIG. 7, the protective layer 165 may be disposed between the substrate 110 and the connecting wire 179a in the bending area BA. Thus, the connecting wire 179a may be disposed on the protective layer 165. Unlike in the exemplary embodiment of FIG. 5, an upper surface of the protective layer 165 is not flatly formed to include an uneven portion thereon. A peak U1 and a valley U2 of the protective layer 165 may extend in the first direction D1 that is substantially parallel with the bending axis BX. Thus, the peak U1 and the valley U2 of the protective layer 165 may be alternatingly arranged one by one in the second direction D2. The connecting wire 179a may be conformally formed on the protective layer 165 by the action of this uneven structure of the protective layer 165 to form a shape including multiple curves (e.g., a wrinkle shape). The wrinkle of the connecting wire 179a may be unfolded like a bellows of an accordion when the bending area BA is bent, and thus a risk of disconnection of the connecting wire 179a may be further reduced. Even though the connecting wire 179a is wrinkly formed, it may extend substantially linearly in a plan view.

A gate conductor including a gate line, the gate electrode 124 of the transistor, a first wire 127, and second wire 129 is disposed on the gate insulating layer 140. The gate conductor may include a metal such as molybdenum (Mo), copper (Cu), aluminum (Al), silver (Ag), chromium (Cr), tantalum (Ta), or titanium, or a metal alloy thereof.

The driving voltage line 172 may be positioned at a same layer as that of the source electrode 173 and the drain electrode 175 of the transistor. Thus, a first data conductor including the driving voltage line 172 as well as the data line, the source electrode 173 and the drain electrode 175, and the voltage transfer line 177, and the connecting wire 179a may be disposed on the interlayer insulating layer 160. A planarization layer 180 including an organic insulating material may be disposed on the first conductor. The connecting wire 179a may be surrounded by the protective layer 165 and the planarization layer 180 to prevent damage during bending. However, as in the exemplary embodiment of FIG. 5, the display device may include a first planarization layer and a second planarization layer above the first conductor, and the driving voltage line 172 may be disposed between the first planarization layer and the second planarization layer.

The connecting wire 179a may be formed by depositing a metal material on the protective layer 165 and then using a photolithography process. When the connecting wire 179a is formed, a photoresist portion positioned on the peak U1 may be exposed more than a photoresist portion positioned on the valley U2. Thus, even when the connection wirings 179a having a uniform width are intended to be formed, a wire width of a portion of the connecting wire 179a disposed on the peak U1 may be smaller than that of a portion of the connecting wire 179a disposed on the valley U2. Thus, it is possible to compensate for the weakness of the adhesion caused by reduction in the wire width by widely forming the portion of the connecting wire 179a positioned on the peak U1. Examples thereof are described in more detail below with reference to FIGS. 8 to 11.

Figure 8:
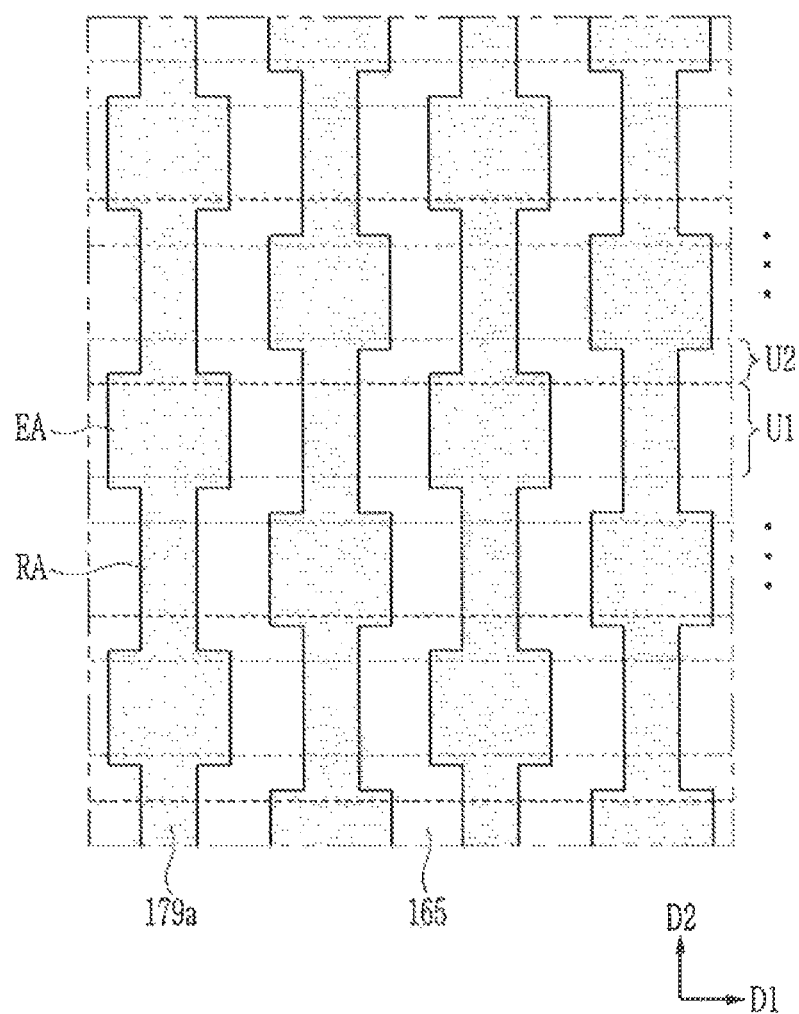
FIGS. 8 to 11 are each enlarged views illustrating a region E in FIG. 1 according to an exemplary embodiment of the present invention.
Figure 9:
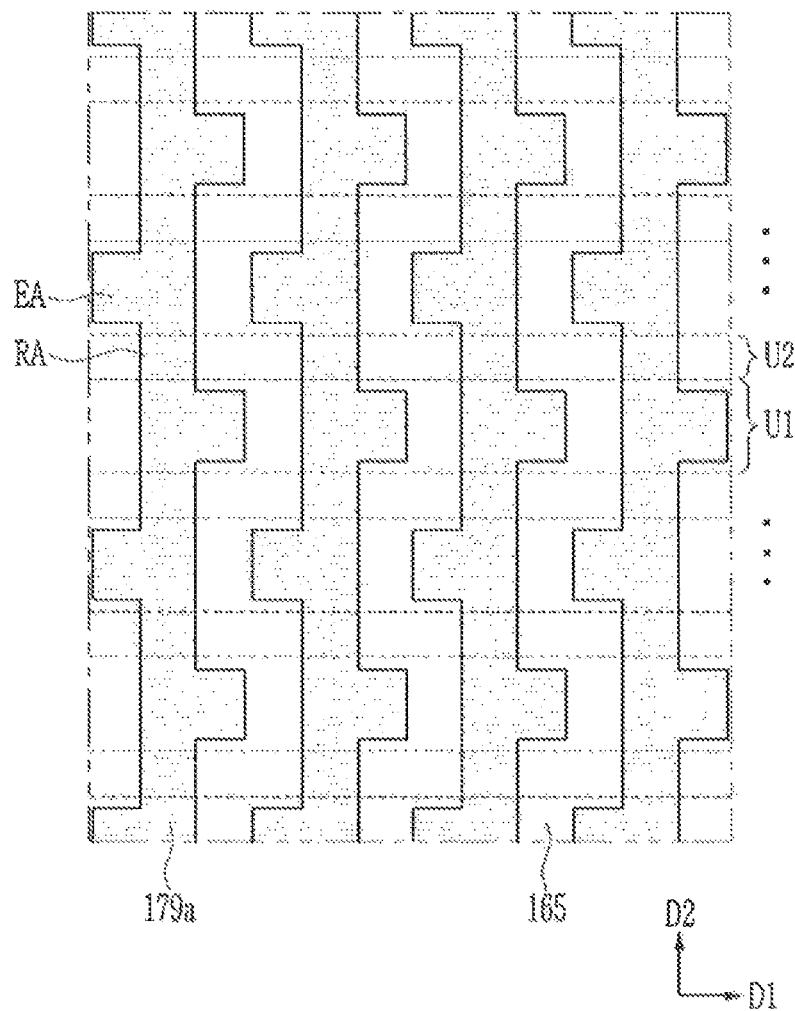

Referring to FIG. 8, in the connecting wire 179a, the extended portions EA and the reduced portions RA may be repeatedly formed along the extending direction of the connecting wire 179a. The extended portions EA may be disposed on the peak U1 of the protective layer 165. Thus, it is possible to increase the adhesion of the connecting wire 179a by widely forming a portion of the connecting wire 179a positioned on the peak U1 of the protective layer 165.

The extended portions EA may be disposed on all peaks U1 of the protective layer 165, but the reduced portion RA may be disposed on a peak U1. For example, referring to FIG. 8, the reduced portions RA may be positioned over two valleys U2 and the peak U1 therebetween, and may be positioned over a larger number of valleys U2 and peaks U1.

Figure 10:
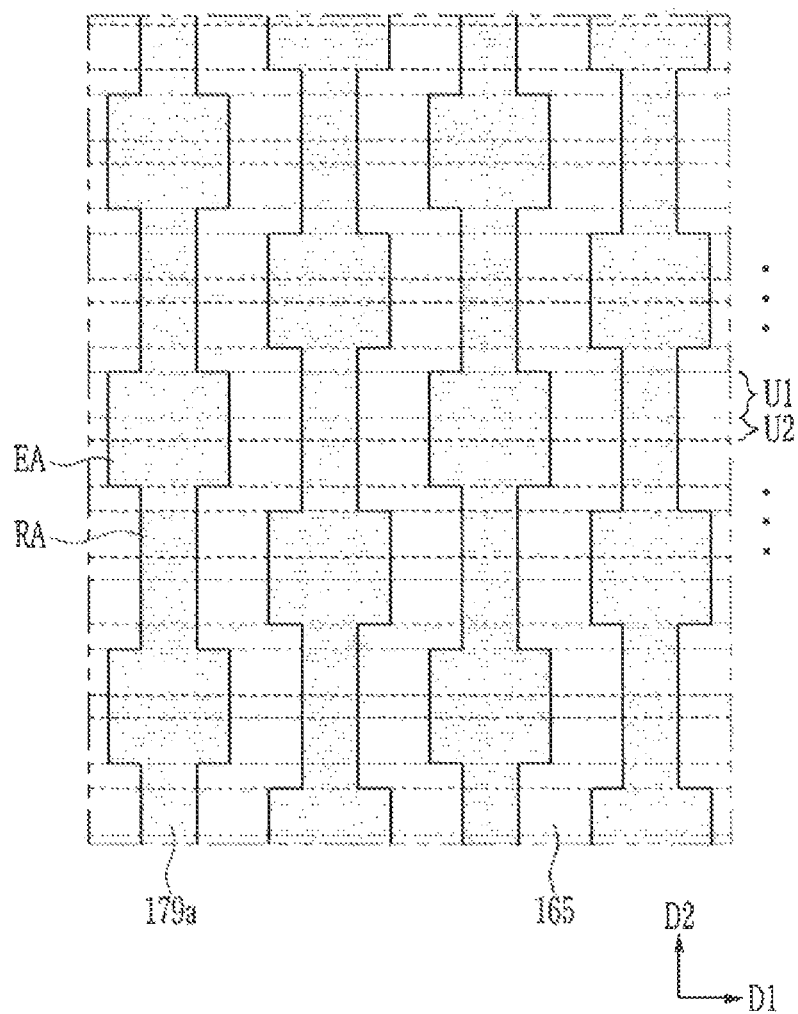
Figure 11:
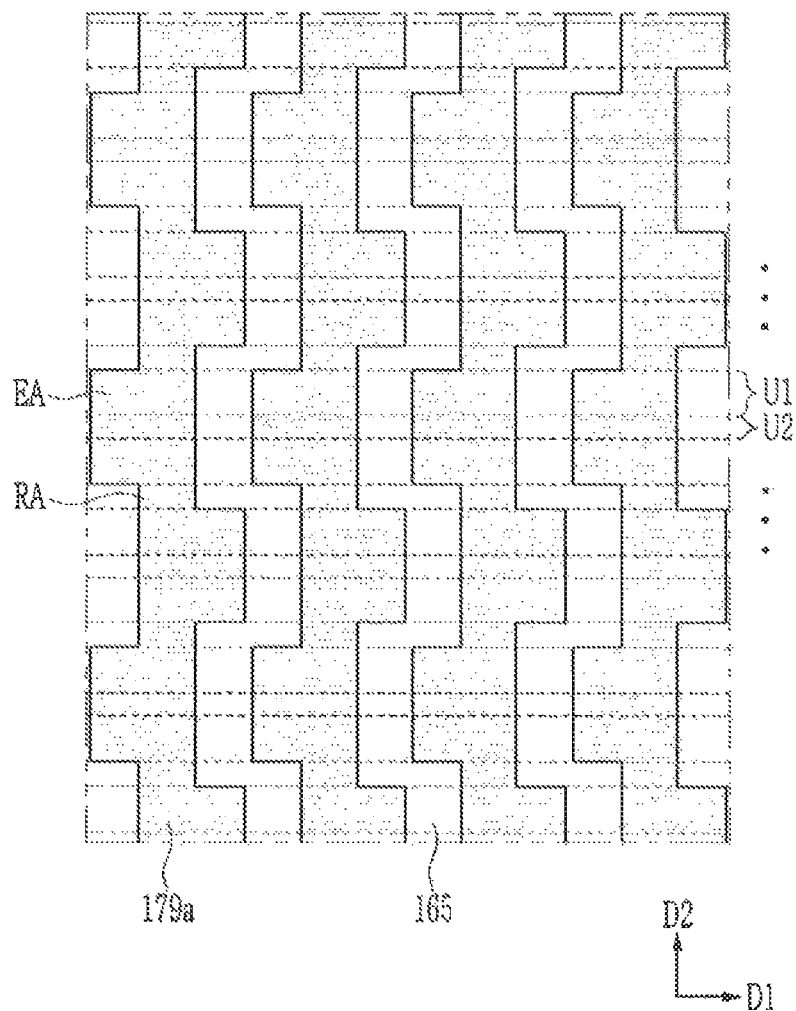

A shape, size, and interval of the extended portions EA and the reduced portions RA of the connecting wire 179a may be variously modified. For example, referring to FIG. 9, the extended portions EA may be formed to include a portion that protrudes toward one side of the reduced portions RA. Referring to FIG. 10 and FIG. 11, the extended portions EA may be formed over a plurality of peaks U1 of the protective layer 165 and valleys U2 therebetween.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display device comprising:
a substrate including a first area, a second area, and a bending area between the first area and the second area;
a transistor positioned on the substrate;
a light emitting diode connected to the transistor;
a plurality of first wires positioned in the first area;
a plurality of second wires positioned in the second area;
an insulating layer positioned in the bending area; and
a plurality of connecting wires disposed on the insulating layer, wherein each of the plurality of connecting wires is connected with at least one of the plurality of first wires and at least one of the plurality of second wires,
wherein each of the plurality of connecting wires includes a first portion and a second portion alternatingly arranged along an extending direction of each of the plurality of connecting wires in the bending area, wherein a width of the first portion is wider than a width of the second portion in a direction perpendicular to the extending direction of each of the plurality of connecting wires, wherein the plurality of connecting wires include a first connecting wire and a second connecting wire which are adjacent to each other,
wherein the first portion of the first connecting wire is disposed in parallel with the second portion of the second connecting wire along the direction perpendicular to the extending direction of each of the plurality of connecting wires, and
wherein the first portion of the first connecting wire is adjacent to and overlaps the second portion of the second connecting wire and the second portion of the first connecting wire is adjacent to and overlaps the first portion of the second connecting wire in the direction perpendicular to the extending direction of each of the plurality of connecting wires in the bending area.

2. The display device of claim 1, wherein at least one of the plurality of connecting wires is in direct contact with the insulating layer.

3. The display device of claim 2, wherein at least one of the plurality of connecting wires includes a metal material, and wherein the insulating layer includes an organic insulating material.

4. The display device of claim 1, wherein the first portion protrudes from opposite sides of the second portion along the direction perpendicular to the extending direction of each of the plurality of connecting wires.

5. The display device of claim 1, wherein the first portion of each of the plurality of connecting wires has a smaller width along the extending direction of each of the plurality of connecting wires than that of the second portion.

6. The display device of claim 3, wherein the insulating layer includes a plurality of peaks and a plurality of valleys, and
wherein the first portion is disposed on one of the plurality of peaks.

7. The display device of claim 6, wherein the first portion is disposed over at least two of the plurality of peaks.

8. The display device of claim 1, wherein at least one of the plurality of connecting wires is a data signal line for transferring data signals.

9. A display device comprising:
a substrate including a bending area that is bent around a bending axis that is in parallel with a first direction;
a transistor disposed on the substrate;
a light emitting diode connected to the transistor;
a first wire linearly extended in a second direction that crosses the first direction in the bending area, wherein the first wire includes a first portion having a first width along the first direction and a second portion having a second width different from the first width along the first direction;
a second wire linearly extended in the second direction in the bending area adjacent to the first wire, wherein the second wire includes a first portion having a first width along the first direction and a second portion having a second width along the first direction, wherein the first portion of the second wire faces the second portion of the first wire along the first direction; and
a first insulating layer disposed between the substrate and the wire in the bending area, wherein the first insulating layer includes an organic insulating material,
wherein the first width of the first portion is wider than the second width of the second portion, and
wherein the first portion of the first wire is adjacent to and overlaps the second portion of the second wire and the second portion of the first wire is adjacent to and overlaps the first portion of the second wire in the first direction in the bending area.

10. The display device of claim 9, wherein the first wire includes a metal material, and wherein a lower surface of the first wire is in direct contact with an upper surface of the first insulating layer.

11. The display device of claim 10, wherein a lower surface of the first insulating layer is in direct contact with an upper surface of the substrate.

12. The display device of claim 10, further comprising a second insulating layer disposed on the first insulating layer and including an organic insulating material,
wherein an upper surface of the first wire is in direct contact with a lower surface of the second insulating layer.

13. The display device of claim 9, further comprising a second insulating layer disposed on the first insulating layer and including an organic insulating material,
wherein a lower surface of the wire is in direct contact with an upper surface of the second insulating layer.

14. The display device of claim 9, wherein the first portion and the second portion of each of the first and second wires are alternatingly arranged along an extending direction of the first and second wires.

15. The display device of claim 9, wherein a difference between the first width and the second width of each of the first and second wires is about 1 µm or more.

16. The display device of claim 9, wherein the first insulating layer includes a plurality of peaks and a plurality of valleys that are alternatingly formed along the second direction, and
wherein the first portion is disposed on one of the plurality of peaks.

17. The display device of claim 16, wherein the first portion is disposed over at least two of the plurality of peaks.

18. The display device of claim 9, wherein the first wire includes no opening therein.

19. The display device of claim 9, wherein the first portion of the first wire entirely overlaps with the second portion of the second wire along the first direction.

* * * * *